United States Patent
Quick et al.

(10) Patent No.: US 8,785,239 B2
(45) Date of Patent: Jul. 22, 2014

(54) METHODS OF DEPOSITING ANTIMONY-COMPRISING PHASE CHANGE MATERIAL ONTO A SUBSTRATE AND METHODS OF FORMING PHASE CHANGE MEMORY CIRCUITRY

(71) Applicant: Micron Technology, Inc., Boise, ID (US)

(72) Inventors: Timothy A. Quick, Boise, ID (US); Eugene P. Marsh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/936,957

(22) Filed: Jul. 8, 2013

(65) Prior Publication Data

US 2013/0295717 A1 Nov. 7, 2013

Related U.S. Application Data (63) Continuation of application No. 13/478,460, filed on May 23, 2012, now Pat. No. 8,481,361, which is a continuation of application No. 12/424,387, filed on Apr. 15, 2009, now Pat. No. 8,198,129.

(51) Int. Cl.
*H01L 21/06* (2006.01)
*H01L 21/20* (2006.01)

(52) U.S. Cl.
USPC .......................................... 438/102; 438/396

(58) Field of Classification Search
USPC ................................. 438/102, 396
See application file for complete search history.

(56) References Cited

U.S. PATENT DOCUMENTS

| 6,005,127 | A | 12/1999 | Todd et al. |
| 6,110,597 | A | 8/2000 | Fujisawa et al. |
| 6,718,152 | B2 | 4/2004 | Geervasi et al. |
| 2006/0138393 | A1 | 6/2006 | Seo et al. |
| 2007/0102678 | A1 | 5/2007 | Kodas et al. |
| 2007/0159945 | A1 | 7/2007 | Ohno et al. |
| 2008/0026220 | A9 | 1/2008 | Bi et al. |
| 2008/0108174 | A1 | 5/2008 | Park et al. |
| 2008/0200014 | A1 | 8/2008 | Park et al. |
| 2008/0258127 | A1 | 10/2008 | Lee et al. |
| 2009/0112009 | A1 | 4/2009 | Chen et al. |
| 2009/0194757 | A1 | 8/2009 | Lam et al. |

FOREIGN PATENT DOCUMENTS

| KR | 10-2009-0029488 | 3/2009 |
| WO | PCT/US2010/028507 | 10/2011 |

OTHER PUBLICATIONS

PCT/US2010/028507SearchReport, Nov. 30, 2010, Micron Technology, Inc.
PCT/US2010/028507WrittenOpinio, Nov. 30, 2010, Micron Technology, Inc.
Hudgens et al., "Overview of Phase-Change Chalcogenide Nonvolatile Memory Technology", MRS bulletin, Nov. 2004, pp. 829-832.
Lacaita, "Phase change memories: State-of-the-art, challenges and perspectives", Solid-State Electronics 50, 2006, pp. 24-31.
Lai, "Current status of the phase change memroy and its future", Intel Corp, Santa Clara, CA, 4 pages.

*Primary Examiner* — Kevin Parendo
(74) *Attorney, Agent, or Firm* — Wells St. John P.S.

(57) ABSTRACT

A method of depositing an antimony-comprising phase change material onto a substrate includes providing a reducing agent and vaporized $Sb(OR)_3$ to a substrate, where R is alkyl, and forming there-from antimony-comprising phase change material on the substrate. The phase change material has no greater than 10 atomic percent oxygen, and includes another metal in addition to antimony.

12 Claims, 9 Drawing Sheets

METHODS OF DEPOSITING ANTIMONY-COMPRISING PHASE CHANGE MATERIAL ONTO A SUBSTRATE AND METHODS OF FORMING PHASE CHANGE MEMORY CIRCUITRY

RELATED PATENT DATA

This patent resulted from a continuation application of U.S. patent application Ser. No. 13/748,460 which was filed on May 23, 2012, which is a continuation application of U.S. patent application Ser. No. 12/424,387, which was filed Apr. 15, 2009, both of which are hereby incorporated by reference.

TECHNICAL FIELD

Embodiments disclosed herein pertain to methods of depositing antimony-comprising phase change material onto a substrate and to methods of forming phase change memory circuitry.

BACKGROUND

Integrated circuit memory may be characterized as being either volatile or non-volatile. Volatile memory must be reprogrammed/rewritten, typically multiple times per second, due to charge dissipation. Non-volatile memory, on the other hand, can maintain any of its programmed states without necessarily requiring periodic refresh. Example volatile memory includes Dynamic Random Access Memory (DRAM). Example non-volatile memory includes Static Random Access Memory (SRAM), Flash Memory, and Phase Change Memory (PCM).

There is a continuing goal in the fabrication of integrated circuitry to make individual devices smaller to increase the density of the circuitry, and thereby either reduce the size of the circuitry or enable more circuitry to be packed into a smaller space. Yet, the smaller and denser circuitry must be reliable in operation. Phase change memory is of increasing interest due to its apparent ability to be scaled smaller and maintain reliability.

The primary components of phase change memory are a pair of electrodes having a phase change material sandwiched there-between. The phase change material is capable of being selectively modified in a manner that changes its electrical resistance between at least high and low resistant states which can be "read" and therefore used as solid-state memory. In phase change memory, electric currents of different magnitudes are selectively passed to the phase change material which changes the resistance of the material very rapidly.

Phase change materials are often formed of a combination or alloy of different metals. One metal of interest is antimony. Such might be combined, for example, with one or both of germanium and tellurium to form a GeSb, SbTe, or GeSbTe alloy. Chemical vapor deposition is one method by which such phase change materials may be deposited over a substrate. For example, different deposition precursors comprising one each of germanium, antimony and tellurium may be provided in desired quantities over a substrate under suitable conditions such that a GeSbTe alloy is deposited having desired quantities of the respective germanium, antimony and tellurium. Example antimony precursors include tris dimethylamino antimony and organometallics such as tris isopropyl antimony. Such precursors may, however, require substrate temperatures in excess of 400° C. to achieve adequate deposition when used in chemical vapor or atomic layer deposition also using $NH_3$. Such temperatures may be incompatible with features on the substrates, or with other precursors, for example tellurium precursors. Use of temperatures lower than 400° C. may result in no deposition, less than desired deposition, or an unacceptably slow rate of deposition.

Phase change materials may also be used in fabrication of rewritable media, for example rewritable CDs and DVDs.

While embodiments of the invention were motivated in addressing the above-identified issues, the invention is in no way so limited.

DETAILED DESCRIPTION OF EXAMPLE EMBODIMENTS

Embodiments of the invention encompass methods of depositing an antimony-comprising phase change material onto a substrate. Such includes providing a reducing agent and vaporized $Sb(OR)_3$ to a substrate, where R is alkyl, and forming there-from antimony-comprising phase change material on the substrate. Some example $Sb(OR)_3$ materials are $Sb(OC_2H_5)_3$, $Sb(OCH_3)_3$, $Sb(OC_3H_7)_3$, and $Sb(OC_4H_9)_3$. The phase change material has no greater than 10 atomic percent oxygen and comprises another metal in addition to antimony. In one embodiment, the phase change material which is formed has no greater than 5 atomic percent oxygen, and in one embodiment no greater than 1 atomic percent oxygen. Ideally, the phase change material is formed to have no detectable oxygen present therein. Regardless, in one embodiment, the substrate temperature while the reducing agent and the vaporized $Sb(OR)_3$ are provided to the substrate is no greater than 450° C.

The reducing agent and the $Sb(OR)_3$ may be provided to the substrate at the same time, and/or at different times. Regardless, example techniques include chemical vapor deposition (CVD) and atomic layer deposition (ALD), including a combination of ALD and CVD methods. Further, any deposition may be plasma enhanced, or conducted in the absence of plasma. Any existing or yet-to-be developed reducing agent capable of removing at least some of the alkoxy ligands from the antimony may be used, with $NH_3$, $H_2$, $CH_2O$, and $CH_2O_2$ being examples. Multiple of these and/or additional reducing agents may be used.

In some embodiments, example metals in addition to antimony in forming an antimony-comprising phase change material include one or both of Ge and Te. Example germanium precursors include tetrakis-dimethylamido germanium, germanium halides (i.e., $GeCl_4$), germanium hydride ($GeH_4$), tetrakis-trimethylsilyl germanium, tetraalkyl germanes (i.e., $Ge(CH_3)_4$), and amindinates (i.e., bis(N,N'-diisopropyl-N-butylamidinate) germanium (II)). Analogous compounds incorporating tellurium instead of germanium may be used as tellurium precursors. In chemical vapor deposition, such additional precursors in one embodiment are provided to the substrate at the same time as providing the $Sb(OR)_3$ to the substrate. Relative portions of the $Sb(OR)_3$, Ge-comprising precursor, and Te-comprising precursor can be used to impart desired atomic quantity of Sb, Ge, and Te in the resulting material. One specific example is $Ge_2Sb_2Te_5$. Other example metals in addition to antimony include selenium, indium, gallium, boron, tin, and silver. Some nitrogen and silicon might additionally be present.

An example temperature range for the substrate during formation of the antimony-comprising phase change material is from 200° C. to 450° C. Where tellurium precursors are being used, an example substrate temperature range is from 300° C. to 360° C. An example pressure range is from $10^{-6}$ Torr to atmospheric pressure. In one embodiment, an example chemical vapor deposition pressure range is from 1 mTorr to 10 Torr. In one embodiment, an example atomic layer deposition pressure range is from 0.1 mTorr to 1 Torr.

Figure 1:
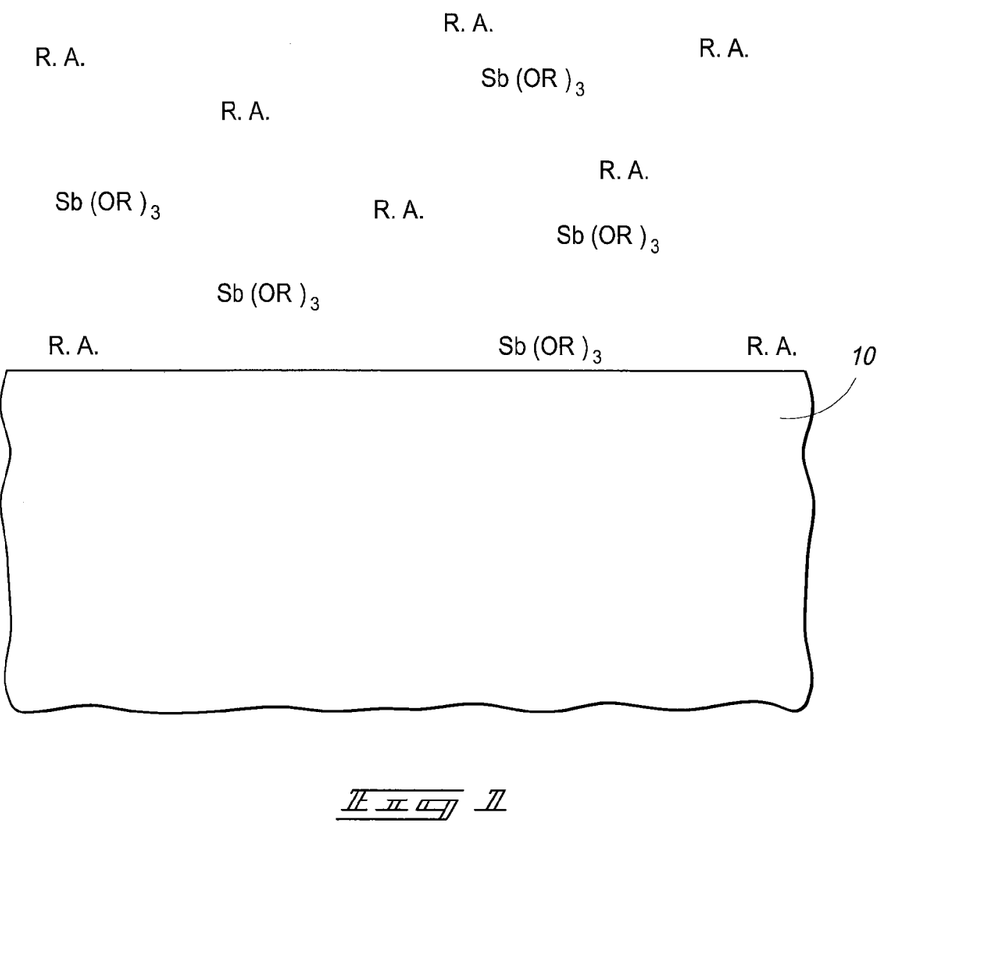
FIG. 1 is a diagrammatic sectional view of a substrate in process in accordance with an embodiment of the invention.
Figure 2:
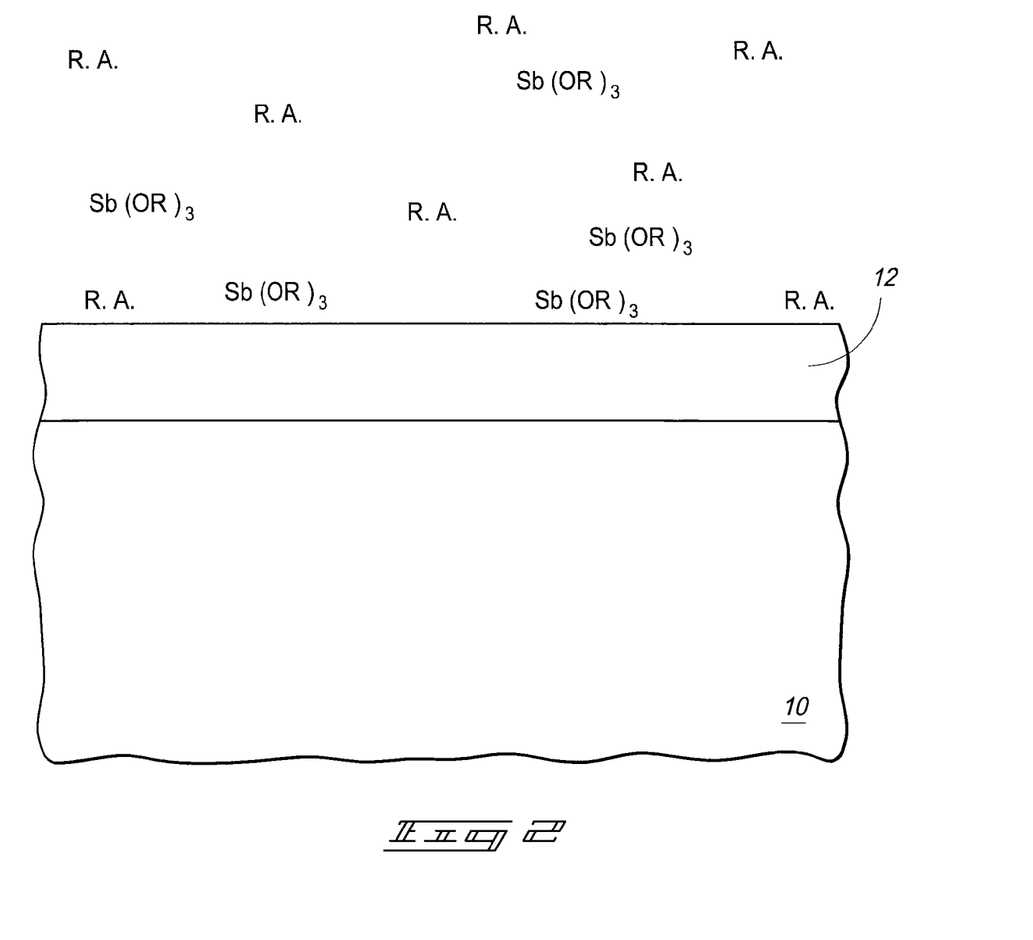
FIG. 2 is a view of the FIG. 1 substrate at a processing step subsequent to that shown by FIG. 1.

An example embodiment of a method of depositing an antimony-comprising phase change material onto a substrate is described with reference to FIGS. 1 and 2. FIG. 1 depicts a substrate 10 over which an antimony-comprising phase change material will be deposited. Substrate 10 might comprise any substrate, including semiconductor substrates. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 10 may be a suitable substrate to be used in formation of rewritable optical media, for example CDs and DVDs. Regardless, any existing or yet-to-be developed substrate 10 may be used.

FIG. 1 depicts an embodiment wherein both $Sb(OR)_3$ and one or more reducing agents (R.A.) are provided over substrate 10 at the same time. For example, such might occur by CVD in any suitable chamber, and under conditions which the precursors combine at or above the surface of substrate 10 to deposit an antimony-comprising phase change material 12 thereover (FIG. 2). For example, $Sb(OR)_3$ can be provided as a liquid in a vaporizer, with an inert gas flowed thereover to carry $Sb(OR)_3$ vapor to substrate 10 within a deposition chamber. Example carrier gases include helium, argon, and $N_2$. In a single wafer processer having an internal chamber volume of from about 2 to 3 liters, an example flow rate of a carrier gas is from 20 sccm to 50 sccm. An example flow rate for the reducing agent is from 500 sccm to 5 slm. Plasma may or may not be used.

A precursor comprising one or more additional metals other than antimony may also be provided within the chamber at the same time with the $Sb(OR)_3$ to incorporate such additional metal(s) within material 12. Alternately or in addition thereto, such could be provided subsequent to provision of the $Sb(OR)_3$ within the chamber. Further by way of example, sequential/pulsed CVD may be used. For example, $Sb(OR)_3$ and/or a precursor containing an additional metal could be fed to the substrate surface in the absence of a reducing agent wherein physisorption of the precursor(s) occurs to the substrate. This could be followed by flowing one or more reducing agents to the substrate to deposit the desired antimony-comprising phase change material onto the substrate.

In a specific example in formation of an antimony and germanium-comprising phase change material, a substrate was positioned upon a chuck within a deposition chamber, with the chuck being heated to about 360° C. Pressure within the chamber was 1 Torr. Liquid $Sb(OC_2H_5)_3$ was provided in a vaporizer/bubbler at 90° C. and liquid bis(N,N'-diisopropyl-N-butylamidinate) germanium (II) provided in another vaporizer/bubbler at 95° C. Argon as a carrier gas was flowed through each of the vaporizers at 50 sccm and then to the deposition chamber. $NH_3$ was also flowed to the deposition chamber at 2000 sccm. An antimony and germanium-comprising phase change material was deposited upon the substrate. The deposited layer had no detectable oxygen present.

An example ALD method is next described with reference to FIGS. 3-6. ALD involves formation of successive atomic layers on a substrate. Such layers may comprise an epitaxial, polycrystalline, amorphous, etc. material. ALD may also be referred to as atomic layer epitaxy, atomic layer processing, etc. Described in summary, ALD includes exposing an initial substrate to a first chemical specie to accomplish chemisorption of the specie onto the substrate. Theoretically, the chemisorption forms a monolayer that is uniformly one atom or molecule thick on the entire exposed initial substrate. In other words, a saturated monolayer is formed. Practically, as further described below, chemisorption might not occur on all portions of the substrate. Nevertheless, such an imperfect monolayer is still a monolayer in the context of this document. In many applications, merely a substantially saturated monolayer may be suitable. A substantially saturated monolayer is one that will still yield a deposited layer exhibiting the quality and/or properties desired for such layer.

The first specie is purged from over the substrate and a second chemical specie is provided to react with the first monolayer of the first specie. The second specie is then purged and the steps are repeated with exposure of the second specie monolayer to the first specie. In some cases, the two monolayers may be of the same specie. As an option, the second specie can react with the first specie, but not chemisorb additional material thereto. That is, the second specie can cleave some portion of the chemisorbed first specie, altering such monolayer without forming another monolayer thereon. Also, a third specie or more may be successively chemisorbed (or reacted) and purged just as described for the first and second species.

Purging may involve a variety of techniques including, but not limited to, contacting the substrate and/or monolayer with a purge gas and/or lowering pressure to below the deposition pressure to reduce the concentration of a specie contacting the substrate and/or chemisorbed specie. Examples of purge gases include $N_2$, Ar, He, etc. Purging may instead include contacting the substrate and/or monolayer with any substance that allows chemisorption byproducts to desorb and reduces the concentration of a contacting specie preparatory to introducing another specie. The contacting specie may be reduced to some suitable concentration or partial pressure known to those skilled in the art based on the specifications for the product of a particular deposition process.

ALD is often described as a self-limiting process, in that a finite number of sites exist on a substrate to which the first specie may form chemical bonds. The second specie might only bond to the first specie and thus may also be self-limiting. Once all of the finite number of sites on a substrate are bonded with a first specie, the first specie will often not bond to other of the first specie already bonded with the substrate.

However, process conditions can be varied in ALD to promote such bonding and render ALD not self-limiting. An example would be an ALD process where insufficient purging is employed such that some CVD occurs. Accordingly, ALD may also encompass a specie forming other than one monolayer at a time by stacking of a specie, forming a layer more than one atom or molecule thick.

The general technology of CVD includes a variety of more specific processes, including, but not limited to, plasma enhanced CVD and others. CVD is commonly used to form non-selectively a complete, deposited material on a substrate. One characteristic of CVD is the simultaneous presence of multiple species in the deposition chamber that react to form the deposited material. Such condition is contrasted with the purging criteria for traditional ALD wherein a substrate is contacted with a single deposition specie that chemisorbs to a substrate or reacts with a previously deposited specie. An ALD process regime may provide a simultaneously contacted plurality of species of a type or under conditions such that ALD chemisorption, rather than CVD reaction occurs. Instead of reacting together, the species may chemisorb to a substrate or previously deposited specie, providing a surface onto which subsequent species may next chemisorb or react to form a complete layer of desired material. Under most CVD conditions, deposition occurs largely independent of the composition or surface properties of an underlying substrate. By contrast, chemisorption rate in ALD might be influenced by the composition, crystalline structure, and other properties of a substrate or chemisorbed specie. Other process conditions, for example, pressure and temperature, may also influence chemisorption rate.

Figure 3:
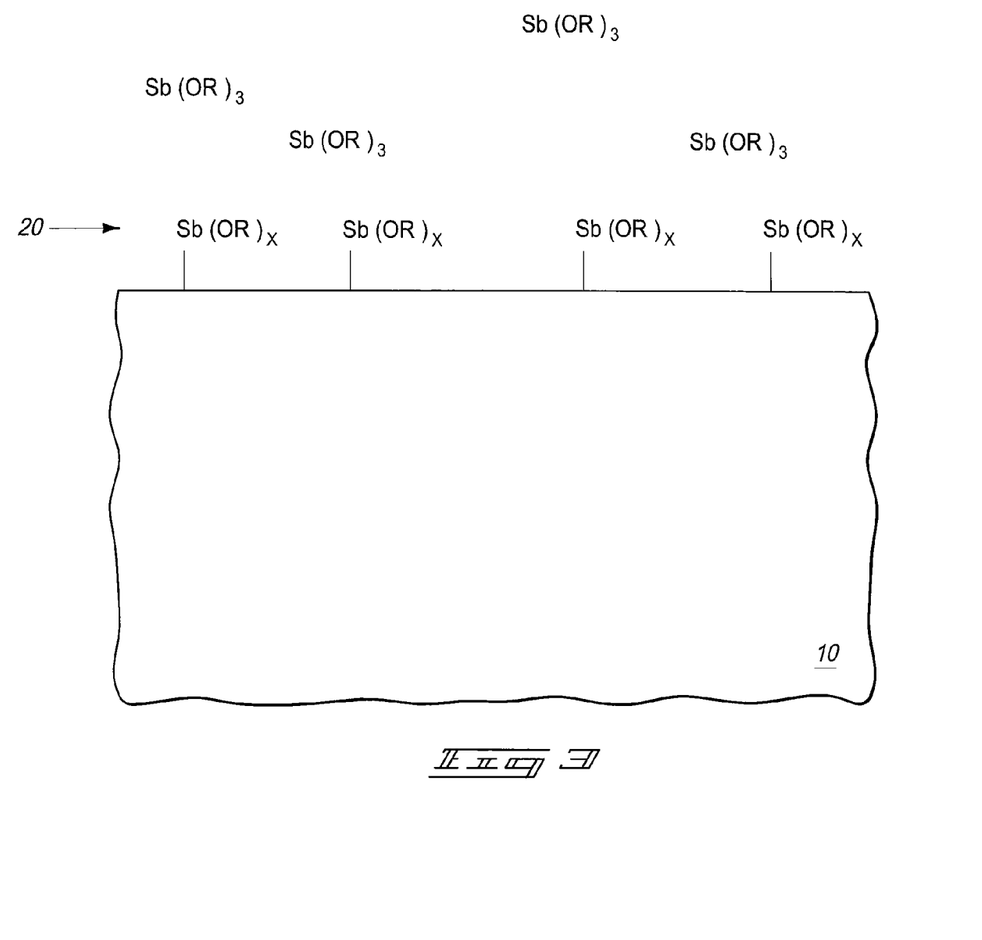
FIG. 3 is a diagrammatic sectional view of a substrate in process in accordance with an embodiment of the invention.

Referring to FIG. 3, vaporized $Sb(OR)_3$, where R is alkyl, is provided over substrate 10 in the absence of the reducing agent. Such has been effective to form a monolayer 20 comprising $Sb(OR)_x$ onto substrate 10 from the $Sb(OR)_3$, where "x" is less than 3.

Figure 4:
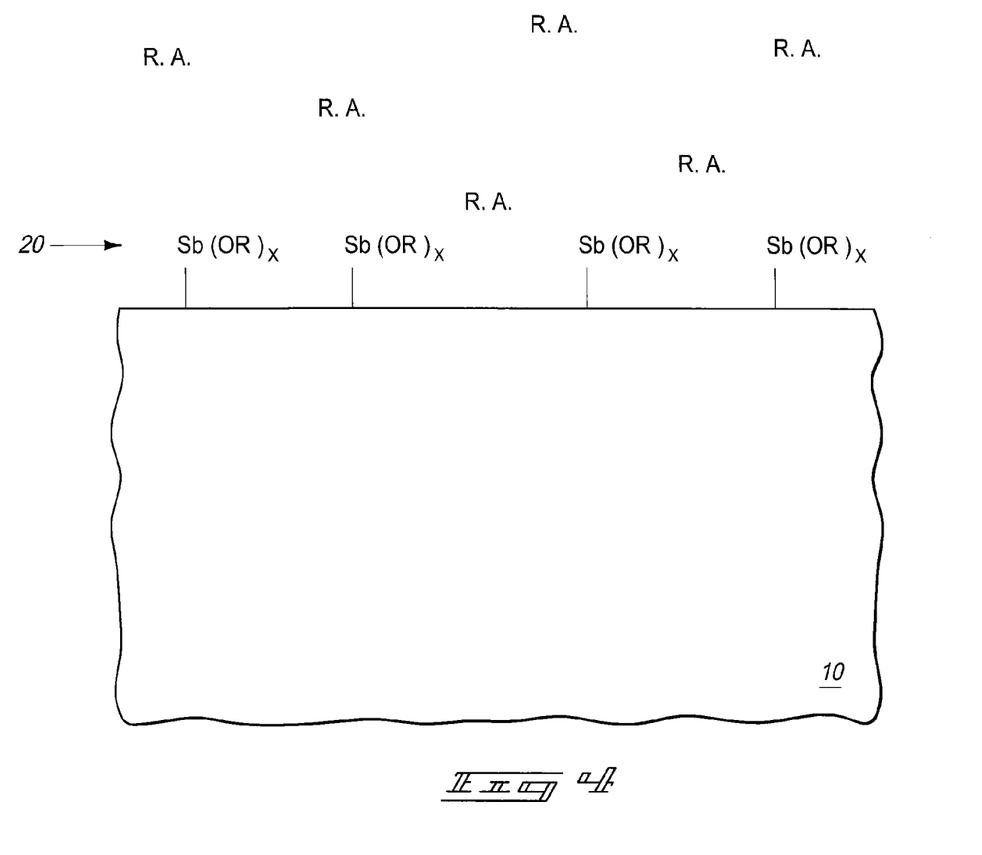
FIG. 4 is a view of the FIG. 3 substrate at a processing step subsequent to that shown by FIG. 3.
Figure 5:
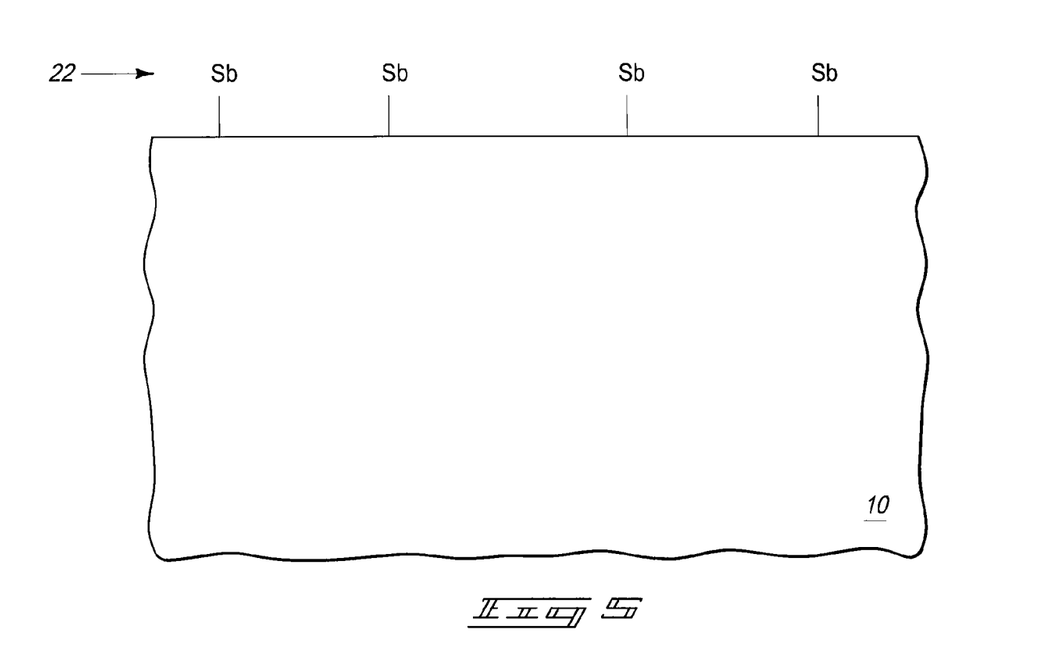
FIG. 5 is a view of the FIG. 4 substrate at a processing step subsequent to that shown by FIG. 4.

Referring to FIGS. 4 and 5, a reducing agent (R.A.) is provided to substrate 10 having monolayer 20 received thereover (FIG. 4) under conditions suitable to remove OR ligand (FIG. 5) from the Sb, thereby forming a monolayer 22 comprising Sb. Any one of combination of the above reducing agents may be used As a specific example, a substrate was positioned upon a chuck within a deposition chamber, with the chuck being heated to about 360° C. Pressure within the chamber was 1 mTorr. Liquid $Sb(OC_2H_5)_3$ was provided in a vaporizer/bubbler at 85° C. Argon as a carrier gas was flowed through the vaporizer at 50 sccm and to the deposition chamber for 2 seconds. Argon flow was then ceased, and the chamber pumped out for 15 seconds. Alternately or additionally, purge gas may be flowed through the deposition chamber. Such was followed by flowing $NH_3$ at 2000 sccm for 2 seconds, followed by pumping out for 15 seconds.

Figure 6:
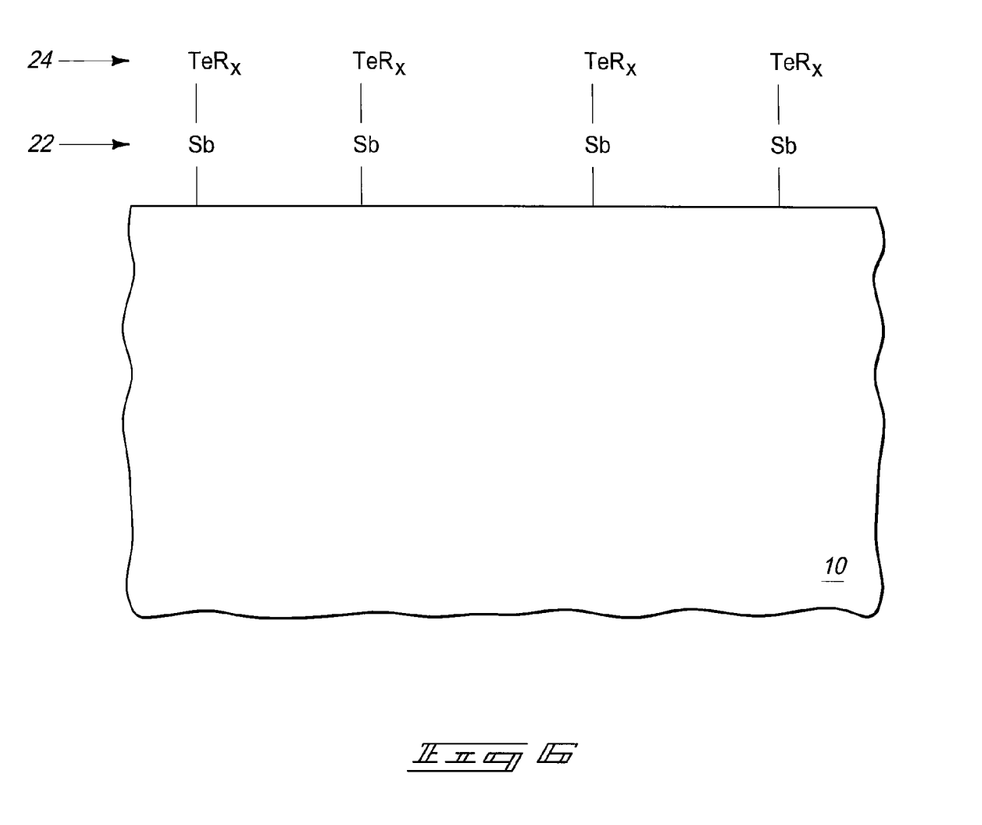
FIG. 6 is a view of the FIG. 5 substrate at a processing step subsequent to that shown by FIG. 5.

FIG. 6, by way of example only, depicts a monolayer 24 comprising $TeR_x$ over monolayer 22. Such may be formed by feeding a suitable tellurium-comprising precursor to the substrate. Such may be followed by feeding of a suitable reducing agent to the substrate to remove $R_x$ ligand from the Te, thereby forming a layer comprising Sb and Te. Such could be repeated multiple times with one or both of $Sb(OR)_3$ and tellurium-comprising precursors (and/or other precursors) to deposit a desired antimony-comprising phase change material over substrate 10. For example, such may be used to produce an antimony and tellurim comprising phase change material having no detectable oxygen present therein. Other precursors including other metals, for example germanium, could also be provided depending on the composition of the antimony-comprising phase change material being formed. Further and regardless, a combination of CVD and ALD techniques may be used.

Figure 7:
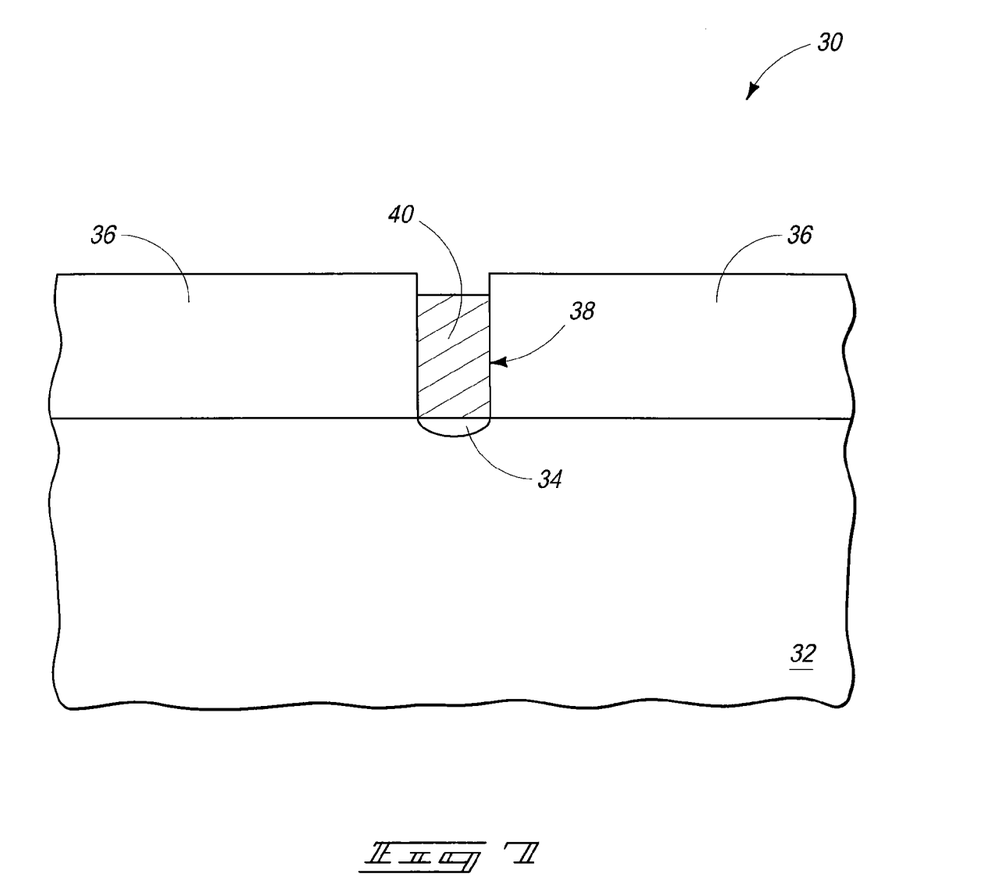
FIG. 7 is a diagrammatic sectional view of a substrate in process in accordance with an embodiment of the invention.

Embodiments of the invention also encompass methods of forming phase change memory circuitry, for example as shown and described with reference to FIG. 7-9. Referring to FIG. 7, such depicts a substrate fragment 30 comprising a semiconductor substrate 32, for example monocrystalline silicon. A conductively doped diffusion region 34 has been formed within semiconductor material of semiconductor substrate 32. A suitable dielectric 36 has been formed thereover, and an opening 38 formed there-through to diffusion region 34. Example suitable dielectric materials include silicon dioxide and/or silicon nitride whether doped or undoped.

Inner electrode material 40 has been formed within opening 38 and in conductive electrical connection with diffusion region 34. Bottom electrode 40 may or may not be homogenous, with tungsten and titanium nitride being example conductive materials.

Figure 8B:
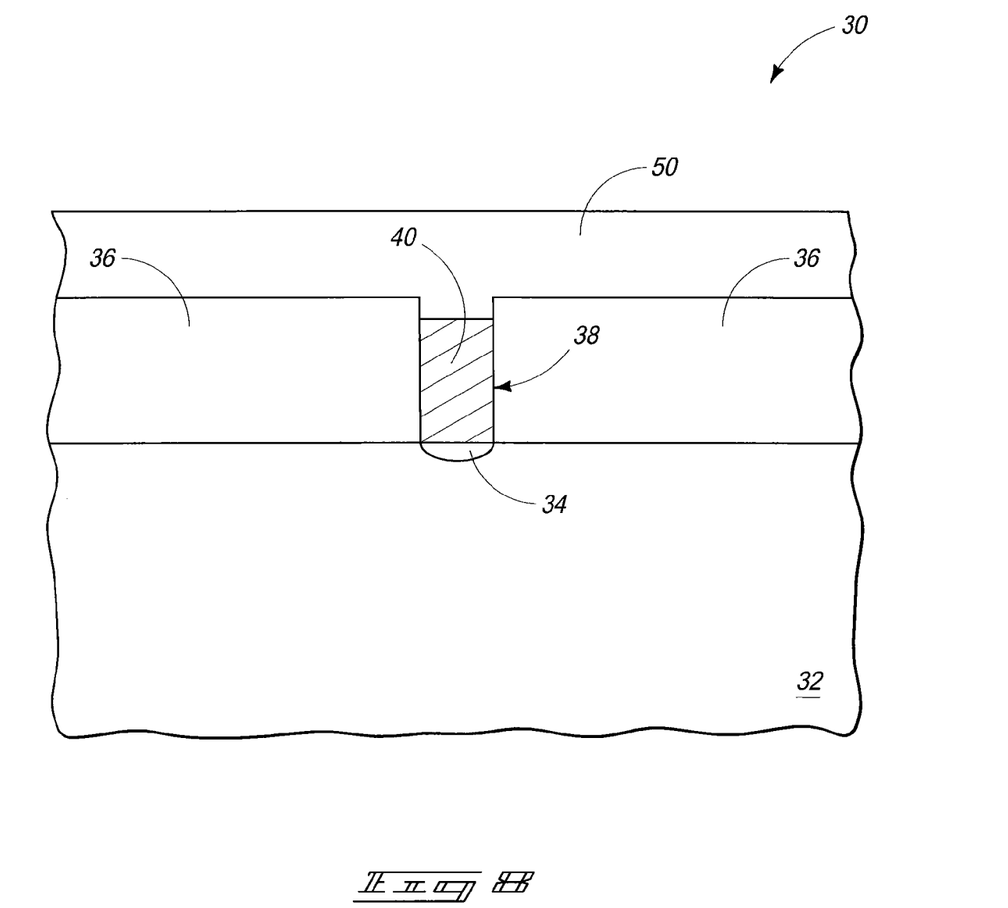
FIG. 8 is a view of the FIG. 7 substrate at a processing step subsequent to that shown by FIG. 7.

Referring to FIG. 8, an antimony-comprising phase change material 50 has been deposited over inner electrode material 40. Such may be deposited by any of the techniques described above, and accordingly has no greater than 10 atomic percent oxygen and includes another metal in addition to antimony.

Figure 9:
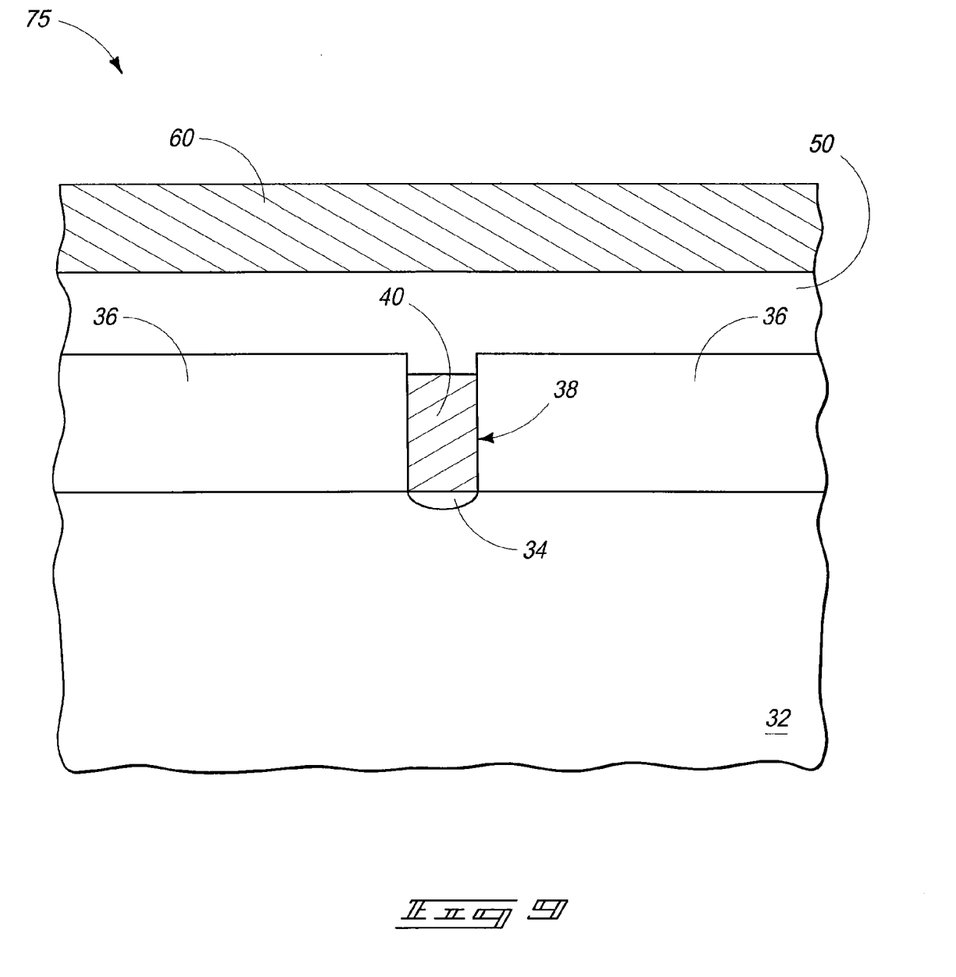
FIG. 9 is a view of the FIG. 8 substrate at a processing step subsequent to that shown by FIG. 8.

Referring to FIG. 9, outer electrode material 60 has been formed over antimony-comprising phase change material 50, thus forming a phase change memory cell 75. Outer electrode material 60 may be the same or different as that of the composition of inner electrode material 40. Antimony-comprising phase change material 50 is shown as being formed in direct physical touching contact with each of inner electrode material 40 and outer electrode material 60, although other embodiments are contemplated. The circuitry may be configured such that one or both of electrode materials 40 and 60 function as the programming electrode whereby a suitable programmable volume of antimony-comprising phase change material 50 between inner electrode material 40 and outer electrode material 60 is switchable between high and low resistance programming states by application of suitable currents, as in existing or yet-to-be developed technology.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of depositing a phase-change material onto a substrate, comprising:

providing a vaporized compound consisting of $Sb(OR)_3$ to a substrate, where R is alkyl and $Sb(OR)_3$ is selected from the group consisting of $Sb(OC_2H_5)_3$, $Sb(OCH_3)_3$, $Sb(OC_3H_7)_3$ and $Sb(OC_4H_9)_3$;

forming a monolayer comprising $Sb(OR)x$ onto the substrate where x is less than 3;

after forming the monolayer, providing a reducing agent to the monolayer;

utilizing the $Sb(OR)_3$ to form an antimony-comprising phase change material.

2. The method of claim 1 wherein the phase change material comprises at least one additional metal.

3. The method of claim 1 wherein the reducing agent and the $Sb(OR)_3$ are provided at the same time.

4. The method of claim 1 wherein the reducing agent comprises one or more member of the group consisting of $NH_3$, $CH_2O$ and $CH_2O_2$.

5. The method of claim 1 wherein the phase change material further comprises at least one of Ge and Te.

6. The method of claim 1 wherein the forming utilizes chemical vapor deposition.

7. A method of forming phase change memory circuitry, comprising:

forming an electrode material over the substrate;

providing a vaporized compound consisting of $Sb(OR)_3$ over the electrode material, where R is alkyl and $Sb(OR)_3$ is selected from the group consisting of $Sb(OC_2H_5)_3$, $Sb(OCH_3)_3$, $Sb(OC_3H_7)_3$ and $Sb(OC_4H_9)_3$;

forming a monolayer comprising $Sb(OR)x$ onto the substrate, where x is less than 3;

after forming the monolayer, providing a reducing agent to the monolayer;

forming an Sb-comprising phase change material utilizing the $Sb(OR)_3$ over the electrode material; and forming an outer electrode material over the phase change material.

8. The method of claim 7 the providing the reducing agent comprises providing the reducing agent over the electrode material.

9. The method of claim 8 wherein the $Sb(OR)_3$ and the reducing agent are provided at the same time.

10. The method of claim 8 wherein the reducing agent is provided after the $Sb(OR)_3$.

11. The method of claim 7 wherein the phase change material comprises at least one additional metal.

12. The method of claim 11 wherein the at least one additional metal is selected from Te and Ge.

* * * * *

UNITED STATES PATENT AND TRADEMARK OFFICE
CERTIFICATE OF CORRECTION

| | | |
|---|---|---|
| PATENT NO. | : 8,785,239 B2 | Page 1 of 1 |
| APPLICATION NO. | : 13/936957 | |
| DATED | : July 22, 2014 | |
| INVENTOR(S) | : Timothy A. Quick et al. | |

It is certified that error appears in the above-identified patent and that said Letters Patent is hereby corrected as shown below:

In the Specification

In column 1, line 10, delete "13/748,460" and insert -- 13/478,460 --, therefor.

Signed and Sealed this
Thirteenth Day of January, 2015

Michelle K. Lee
*Deputy Director of the United States Patent and Trademark Office*